(12) United States Patent
Yang et al.

(10) Patent No.: US 10,185,697 B2
(45) Date of Patent: Jan. 22, 2019

(54) GENERATING A TRANSITION SIGNAL FOR CONTROLLING MEMORY DATA OUTPUT

(71) Applicant: Macronix International Co., Ltd., Hsinchu (TW)

(72) Inventors: Shang-Chi Yang, Xihu Township (TW); Su-Chueh Lo, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 386 days.

(21) Appl. No.: 15/006,316

(22) Filed: Jan. 26, 2016

(65) Prior Publication Data

US 2017/0212696 A1    Jul. 27, 2017

(51) Int. Cl.
| | | |
|---|---|---|
| G06F 13/16 | (2006.01) | |
| G06F 13/40 | (2006.01) | |
| G06F 13/42 | (2006.01) | |
| G06F 12/06 | (2006.01) | |
| G06F 13/28 | (2006.01) | |

(52) U.S. Cl.
CPC ...... *G06F 13/4291* (2013.01); *G06F 13/1673* (2013.01); *G06F 13/4022* (2013.01); *G06F 12/0638* (2013.01); *G06F 13/28* (2013.01)

(58) Field of Classification Search
CPC .. G06F 12/0638; G06F 13/1689; G06F 12/06; G06F 13/4068; G06F 3/0673; G06F 13/4291; G06F 13/1673; G06F 13/4622; G06G 13/28
See application file for complete search history.

(56) References Cited

U.S. PATENT DOCUMENTS

| | | | | |
|---|---|---|---|---|
| 2005/0007835 A1* | 1/2005 | Lee | .......................... | G11C 5/00 |
| | | | | 365/189.12 |
| 2006/0098497 A1* | 5/2006 | Vali | .......................... | G11C 7/02 |
| | | | | 365/189.05 |
| 2008/0238506 A1* | 10/2008 | Choi | ........................ | H03K 7/04 |
| | | | | 327/158 |
| 2009/0067277 A1* | 3/2009 | Smith | .................. | G11C 7/1066 |
| | | | | 365/230.06 |
| 2014/0204684 A1* | 7/2014 | Kwak | ...................... | G11C 7/10 |
| | | | | 365/189.05 |
| 2017/0186475 A1* | 6/2017 | Smith | ................. | G11C 11/4076 |
| 2017/0264277 A1* | 9/2017 | Ma | ........................... | H03K 5/12 |
| 2018/0006636 A1* | 1/2018 | Ma | ........................ | H03K 19/003 |

* cited by examiner

*Primary Examiner* — Henry Tsai
*Assistant Examiner* — Christopher A. Daley
(74) *Attorney, Agent, or Firm* — Fish & Richardson P.C.

(57) ABSTRACT

A memory device comprises an output buffer and a control circuit. The control circuit is configured to receive a system clock signal at an input of the control circuit. The control circuit is configured to generate a data transition signal based on the system clock signal. The control circuit is configured to provide the data transition signal to the output buffer of the memory device. The output buffer is configured to output memory data based on the data transition signal.

14 Claims, 6 Drawing Sheets

GENERATING A TRANSITION SIGNAL FOR CONTROLLING MEMORY DATA OUTPUT

TECHNICAL FIELD

The following disclosure relates generally to generating a transition signal for controlling data output by a memory device.

BACKGROUND

Data stored in a memory device can be read at both the rising and falling edges of a system clock signal in double transfer rate (DTR) mode of operation. There can be a finite delay from the system clock signal transition to data being available at an output buffer of the memory device. In some memory devices, the data output delay associated with the rising edge of the system clock signal can be different from the data output delay associated with the falling edge of the system clock signal.

SUMMARY

The present disclosure describes devices, systems and techniques for improving the accuracy of data output during read operations of a memory device (e.g., a memory array) in DTR mode of operation. In one implementation, a control circuit is coupled to an output buffer of the memory device. The control circuit receives the system clock signal and generates internal signals that are used to adjust times at which data output by the output buffer is triggered such that the strobe windows are equalized for the rising and falling edges of the system clock signal. In one implementation, the control circuit includes one or more configurable inverters. The control circuit performs the adjustment by configuring the inverters to control the generation time of the internal signals on one or both of the edges of the system clock signal.

In one implementation, each configurable inverter includes one or more transistors. One or more inverters are configured using different gate bias voltages of the constituent transistors, depending on whether a period of the trigger signal is to be increased/decreased, based on the rising edge or the falling edge of the system clock signal.

In a general aspect, a memory device comprises an output buffer and a control circuit. The control circuit is configured to receive a system clock signal at an input of the control circuit. The control circuit is configured to generate a data transition signal based on the system clock signal. The control circuit is configured to provide the data transition signal to the output buffer of the memory device. The output buffer is configured to output memory data based on the data transition signal.

Particular implementations may include one or more of the following features. The control circuit may include a first signal path and a second signal path, each including one or more inverters. The data transition signal may include a first internal signal and a second internal signal. Generating the data transition signal may comprise adjusting the system clock signal using one or more inverters in the first signal path to generate the first internal signal at an output of the first path. Generating the data transition signal also may comprise adjusting the system clock signal using one or more inverters in the second signal path to generate the second internal signal at an output of the second path.

The output buffer may be configured to receive the first internal signal and the second internal signal at inputs of the output buffer. In response to receiving a rising edge of the system clock signal at the control circuit, the output buffer may output memory data using a first time window that is based on the first internal signal and the second internal signal. In response to receiving a falling edge of the system clock signal at the control circuit, the output buffer may output memory data using a second time window that is based on the first internal signal and the second internal signal.

The control circuit may be configured to adjust at least one of a time delay corresponding to generation of the first internal signal or a time delay corresponding to generation of the second internal signal such that a difference between the first time window and the second time window is within a preselected threshold value.

The control circuit may be configured to receive a rising edge or a falling edge of the system clock signal at the input of the control circuit. In response to receiving the rising edge of the system clock signal, the control circuit may adjust a first time delay associated with generating the first internal signal or the second internal signal to control output of the memory data by the output buffer using the first time window. In response to receiving the falling edge of the system clock signal, the control circuit may adjust a second time delay associated with generating the first internal signal or the second internal signal to control output of the memory data by the output buffer using the second time window.

The control circuit may be configured to adjust the first time delay independent of the second time delay. An inverter may include a plurality of transistors. An output of the inverter may be adjusted by adjusting gate voltages provided to one or more of the transistors.

The control circuit may be configured to receive a rising edge or a falling edge of the system clock signal at the input of the control circuit. The control circuit may provide different values of gate voltages to one or more transistors in one or more inverters in at least one of the first signal path or the second signal path to generate the first internal signal or the second internal signal with different time delays based on the rising edge or the falling edge of the system clock signal.

Implementations of the above techniques include methods, systems, computer program products and computer-readable media. One such method corresponds to the above-described actions. One such system includes a memory device with an output buffer and a control circuit coupled to the output buffer, and a storage medium storing instructions executable by one or more processors. The instructions, when executed by the one or more processors, are configured to cause the one or more processors to perform the above-described actions. One such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above described actions.

In the manner described above, by adjusting the internal signals such that the strobe windows on the rising and falling edges of the system clock signal are equalized, the data query (DQ) duty cycle of the memory device can be set to be an optimal value, e.g., fifty percent. The equalization of the DQ duty cycle may prevent damage that can otherwise happen to the valid strobe data window for the data query, e.g., in high frequency operations. The devices, systems and techniques can be applied to various types of nonvolatile memory arrays, such as NAND flash memory or NOR flash memory, among others.

The details of one or more disclosed implementations are set forth in the accompanying drawings and the description below. Other features, aspects, and advantages will become apparent from the description, the drawings and the claims.

DETAILED DESCRIPTION

In a memory device that supports a double transfer rate (DTR, which is also referred to as double data rate or DDR) bus, address and data can be transferred on both the rising and falling edges of the system clock signal (SCLK). This can effectively double the read throughput as compared to memory devices using a single transfer rate (STR) bus (e.g., systems where address and data are transferred on either the rising edge or the falling edge of SCLK, but not both).

Figure 1A:
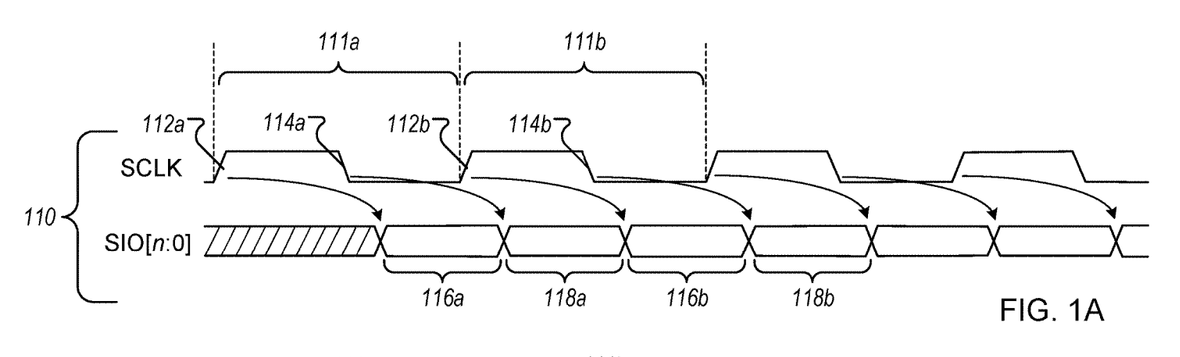
FIGS. 1A and 1B illustrate an example of a memory device and an example of a timing diagram for data output by the memory device.
Figure 1B:
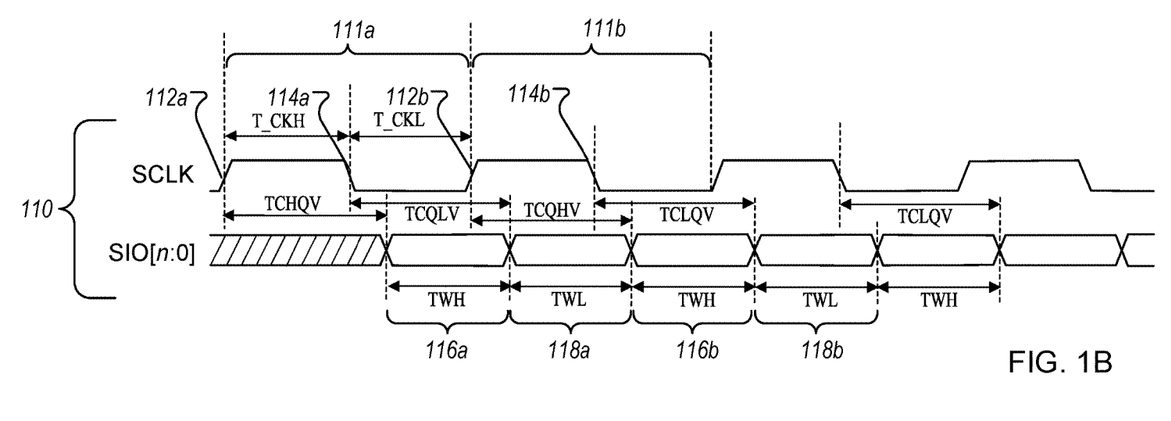

FIGS. 1A and 1B illustrate an example of a memory device 100 and an example of a timing diagram 110 for data output by the memory device 100. The memory device 100 can be a flash memory device, e.g., a serial NOR flash chip or a serial NAND flash chip, or some other suitable memory device. The memory device 100 may be a component of a system (e.g., a microcontroller or other integrated circuit), and communicates with a system host, e.g., a memory controller, central processing unit (CPU), or some other processing module, using DTR mode. In one implementation, the memory device 100 synchronously receives a read command on one serial input/output pin SIO[0], the corresponding memory address on n serial input/output pins SIO[n:0] (where n is a non-negative integer), and then the data is clocked out on the n serial input/output pins SIO[n:0]. The data is clocked out based on the system clock signal SCLK received at the memory device 100, and the data is output on the system bus when the memory device 100 is selected using a chip select signal CS#.

In FIG. 1A, the timing diagram 110 shows one example of the data output by the memory device 100 based on the system clock signal SCLK. 111a and 111b are two clock cycles of SCLK. 112a and 114a are the rising and falling edges respectively of SCLK in the clock cycle 111a, while 112b and 114b are the rising and falling edges respectively of SCLK in the clock cycle 111b. Data output 116a and 116b by SIO[n:0] are triggered on the rising edges 112a and 112b of SCLK, while data output 118a and 118b are triggered on the falling edges 114a and 114b of SCLK.

There is a finite time delay from the rising edge of SCLK to data being output by SIO[n:0] in the memory device 100, and similarly a finite time delay from the falling edge of SCLK to data being output by SIO[n:0]. The time delays are due to finite response times of the internal circuitry of the memory device 100 to read the data from the memory cells and make the data available for output by the output buffer. FIG. 1B shows the time delays from the rising and falling edges of SCLK to data output by SIO[n:0]. The delay between the rising edge transition of SCLK (e.g., 112a or 112b) to data output by SIO[n:0] is referred to as system clock high to output, which is denoted by TCHQV. The delay between the falling edge transition of SCLK (e.g., 114a or 114b) to data output by SIO[n:0] is referred to as system clock low to output, which is denoted by TCLQV. In some memory arrays, TCHQV and TCLQV are not adjustable.

In one clock cycle (e.g., 111a or 111b), SCLK remains high for time period T_CKH, and remains low for time period T_CKL. As shown by the timing diagram 110, T_CKH and T_CKL are approximately equal in the clock cycle 111a, and TCHQV and TCLQV are also approximately equal, such that valid data is output for the rising edge 112a in approximately one half of the clock cycle 111a, while valid data is output for the falling edge 114a in approximately the other half of the clock cycle 111a. Similar conditions hold for the other clock cycles, e.g., 111b.

The data is output as a data query (DQ) over a DQ channel. A data query strobe (DQS) is issued as a wave to indicate that data is being transmitted over the DQ channel. The undulation of the DQS wave is called a duty cycle for the DQ data output, which includes a window for data output on the SCLK rising edge and a window for data output on the SCLK falling edge. Each window for data output is referred to as a strobe window. For example, 116a and 116b are valid strobe windows for SCLK rising edge (TWH), while 118a and 118b are valid strobe windows for SCLK falling edge (TWL). The strobe windows indicate when data can be collected by latches of the memory device.

As shown in FIG. 1B, TWH and TWL depend on SCLK clock cycle, and TCHQV and TCLQV. In some cases, for example as shown by the timing diagram 110, T_CKH is equal to T_CKL in a clock cycle, and TCHQV is equal to TCLQV, such that the strobe windows are equal, which leads to a 50% duty cycle. For example, for a 200 mega-hertz (MHz) SCLK, T_CKH=T_CKL=2.5 nano-seconds (ns). Assuming TCHQV=TCLQV=3 ns, the strobe windows can be computed as:

$$TWL=T\_CKL-(TCLQV-TCHQV)=2.5 \text{ ns}$$

$$TWH=T\_CKH-(TCHQV-TCLQV)=2.5 \text{ ns}$$

In some memory devices that operate in DTR mode, TCHQV and TCLQV can vary, e.g., due to variations in the manufacturing process for the memory device. This can cause TCHQV to differ from TCLQV. Additionally or alternatively, SCLK clock cycle can vary, causing T_CKH to differ from T_CKL. In either of these cases, TWH can differ from TWL due to the dependence of the strobe windows on the SCLK clock cycle and TCHQV and TCLQV.

Figure 2A:
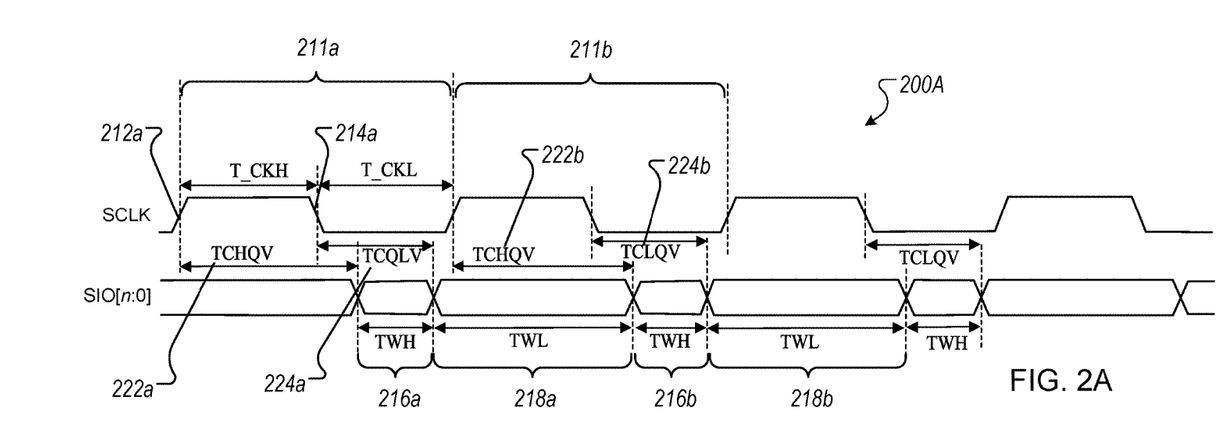
FIGS. 2A and 2B illustrate examples of timing diagrams for memory devices in which the clock rising edge strobe window differs from the clock falling edge strobe window.
Figure 2B:
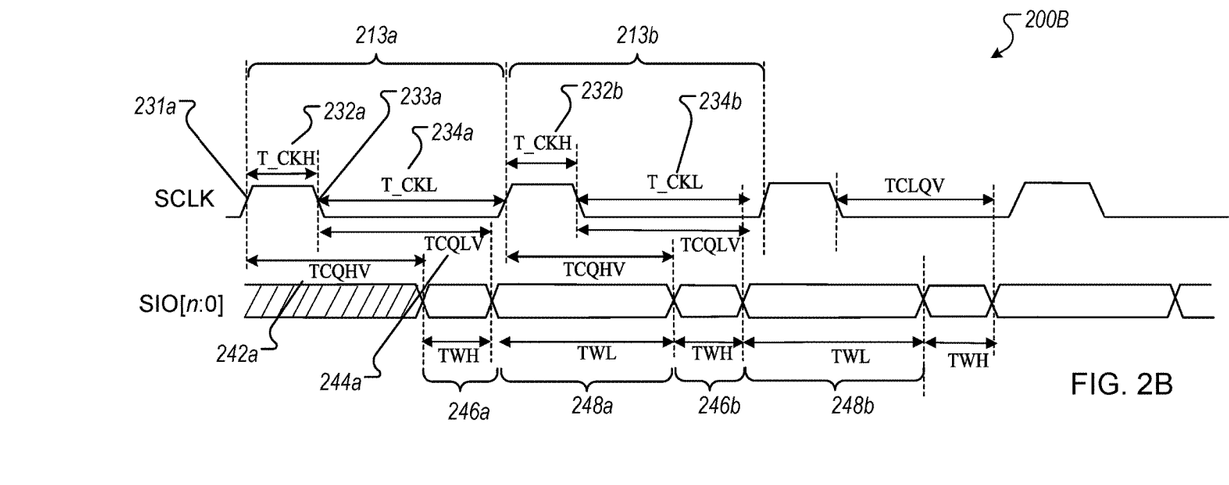

FIGS. 2A and 2B illustrate examples of timing diagrams 200A and 200B for memory devices in which the clock rising edge strobe window differs from the clock falling edge strobe window. In the timing diagram 200A of FIG. 2A, the clock high period T_CKH and the clock low period T_CKL are equal in one clock cycle, e.g., 211a, and similarly for clock cycle 211b. However, TCHQV is different from TCLQV. For example, TCHQV 222a and TCLQV 224a correspond to rising edge 212a and falling edge 214a of SCLK respectively in one cycle 211a, and are associated with one DQ duty cycle. As shown, TCHQV 222a is different from TCLQV 224a. Similarly, TCHQV 222b is different from the succeeding TCLQV 224b that are associated with another DQ duty cycle. Consequently, the strobe windows for clock high TWH and clock low TWL are different. For example, in one DQ duty cycle, TWH strobe window 216a, which is based on the SCLK rising edge 212a and corresponding TCHQV 222a, is different from TWL strobe window 218a, which is based on the SCLK falling edge 214a and corresponding TCLQV 224a. Similarly, TWH strobe window 216b is different from TWL strobe window 218b in another DQ duty cycle.

The following numeric example provides an illustration of the difference in the strobe windows in FIG. 2A. Consider a 200 MHz SCLK in which T_CKH=T_CKL=2.5 ns. However, TCHQV=3 ns, while TCLQV=2 ns. Accordingly, the strobe windows can be computed as:

$$TWL=T\_CKL-(TCLQV-TCHQV)=3.5 \text{ ns}$$

$$TWH=T\_CKH-(TCHQV-TCLQV)=1.5 \text{ ns}$$

Due to the duration of TCHQV delay being greater than the duration of TCLQV delay in the example above, the TWH strobe window is smaller than the TWL strobe window.

In the timing diagram 200B of FIG. 2B, TCHQV is equal to TCLQV, but the clock high period T_CKH is different from the clock low period T_CKL in one clock cycle. For example, T_CKH 232a, which follows the SCLK rising edge 231a, is different from T_CKL 234a, which follows the SCLK falling edge 233a in clock cycle 213a, while T_CKH 232b is different from T_CKL 234b in clock cycle 213b. T_CKH can differ from T_CKL in a clock cycle due to variations in the manufacturing process of the integrated circuit chip, due to system processes, or user configuration of the chip, among other reasons. Consequently, the strobe windows for clock high TWH and clock low TWL are different. For example, in one DQ duty cycle, TWH strobe window 246a, which is based on the rising edge 231a and the corresponding TCHQV 242a, is different from TWL strobe window 248a, which is based on the falling edge 233a and corresponding TCLQV 244a. Similarly, in another DQ duty cycle, TWH strobe window 246b is different from TWL strobe window 248b.

The following numeric example provides an illustration of the difference in the strobe windows in FIG. 2A. Consider a 200 MHz SCLK in which T_CKH=1.5 ns and T_CKL=3.5 ns. However, TCHQV=TCLQV=3 ns. Accordingly, the strobe windows can be computed as:

$$TWL=T\_CKL-(TCLQV-TCHQV)=3.5 \text{ ns}$$

$$TWH=T\_CKH-(TCHQV-TCLQV)=1.5 \text{ ns}$$

Due to variation of the clock cycle, e.g., clock high period T_CKH being less than the clock low period T_CKL in one clock cycle in the example above, the SCLK falling edge occurs earlier in a clock cycle (compared to, e.g., the case where T_CKH ≥T_CKL), which leads to the TWH strobe window being smaller than the TWL strobe window.

Fluctuations in the SCLK clock cycle, or in TCHQV and/or TCLQV as illustrated above, can cause the data path duty cycle of the DQ to become distorted, with the duration of one strobe window being different from the duration of the other strobe window in a duty cycle. In addition to the reasons noted above, such duty cycle distortion can be created by the memory controller driver, channel, receiver, and/or digital latches in a DTR memory device. Such duty cycle distortions can damage the valid DQ strobe window, e.g., increase the probability of data misreads in high frequency operations.

Accordingly, it may be useful to adjust the delays associated with reading data in response to a DQ such that the TWH and TWL strobe windows are equal, thereby causing the DQ duty cycle to be fifty percent. In one implementation, this can be achieved by controlling internal signals in the memory device that trigger memory data output, and thereby adjust the TCHQV delay and/or the TCLQV delay, e.g., to compensate for variations in SCLK clock cycle, such that the TWH strobe window and the TWL strobe window are made equal in one DQ duty cycle.

Figure 3:
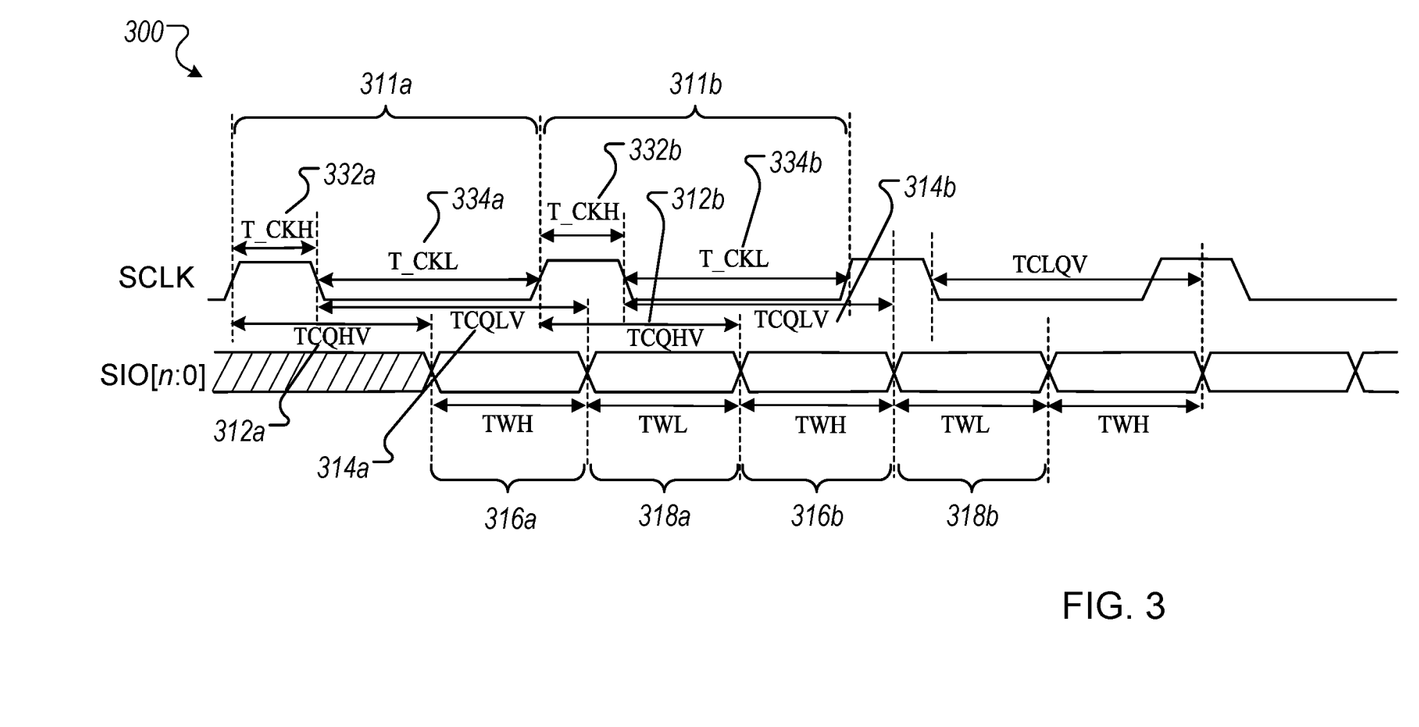
FIG. 3 illustrates an example of a timing diagram for a memory device in which TCHQV and TCLQV are adjusted to make the DQ duty cycle fifty percent, according to one implementation.

FIG. 3 illustrates an example of a timing diagram 300 for a memory device in which TCHQV and TCLQV are adjusted to make the DQ duty cycle fifty percent, according to one implementation. In the timing diagram 300, due to a variation in the SCLK clock cycle, the clock high period T_CKH is different from the clock low period T_CKL in one clock cycle of SCLK. For example, T_CKH 332a is different from T_CKL 334a in clock cycle 311a, while T_CKH 332b is different from T_CKL 334b in clock cycle 311b. However, the values of TCHQV and TCLQV are adjusted, e.g., configured by a user of the memory device, such that TWH strobe window for clock high TWH and TWL strobe window for clock low are made equal to one another, removing the effect of the SCLK clock cycle variation. For example, TCHQV 312a and TCLQV 314a, which correspond to the rising and falling edges of SCLK in clock cycle 311, can be adjusted. Similarly TCHQV 312b and TCLQV 314b, which are associated with clock cycle 311b, can be adjusted. Accordingly, the TWH strobe window is made equal to the TWL strobe window in a DQ duty cycle. For example, TWH strobe window 316a is equal to the TWL strobe window 318a in one DQ duty cycle, while TWH strobe window 316b is equal to the TWL strobe window 318b in another DQ duty cycle. Each of TCHQV or TCLQV can be individually adjusted to be high, or can be individually adjusted to be low.

The following numeric example provides an illustration of the how adjustment in TCHQV or TCLQV, or both, can make the strobe windows of equal duration. Consider a 200 MHz SCLK in which T_CKH=1.5 ns and T_CKL=3.5 ns. The original TCHQV and TCLQV for the memory device were 3 ns, similar to the case of timing diagram 200B. However, in one implementation, TCLQV is adjusted and increased to 4 ns, while TCHQV is maintained at 3 ns. Accordingly, the strobe windows can be computed as:

$$TWL=T\_CKL-(TCLQV-TCHQV)=2.5 \text{ ns}$$

$$TWH=T\_CKH-(TCHQV-TCLQV)=2.5 \text{ ns}$$

Therefore, by increasing the duration of TCLQV to compensate for the smaller T_CKH compared to T_CKL in a clock cycle, the TWH and TWL strobe windows can be made equal to one another, leading to the DQ duty cycle being fifty percent. In contrast, if TCLQV is not adjusted, then TWL strobe window would be longer (e.g., 3.5 ns) compared to TWH strobe window (e.g., 1.5 ns), which is the case with timing diagram 200B.

Alternative implementations are also possible. For example, consider the above scenario with a 200 MHz SCLK in which T_CKH=1.5 ns and T_CKL=3.5 ns. The original TCHQV and TCLQV for the memory device were 3 ns. In one implementation, TCHQV is adjusted and decreased to 2 ns, while TCLQV is maintained at 3 ns. Accordingly, the strobe windows can be computed as:

$$TWL=T\_CKL-(TCLQV-TCHQV)=2.5 \text{ ns}$$

$$TWH=T\_CKH-(TCHQV-TCLQV)=2.5 \text{ ns}$$

Therefore, by decreasing the duration of TCHQV to compensate for the smaller T_CKH compared to T_CKL in a clock cycle, the TWH and TWL strobe windows can be made equal to one another, leading to the DQ duty cycle being fifty percent.

For situations where T_CKH is greater than T_CKL in a SCLK clock cycle, different adjustments can be made to TCHQV or TCLQV. In such cases, the duration of TCHQV can be increased to compensate for the smaller T_CKL compared to T_CKH in a clock cycle. Alternatively, the duration of TCLQV can be decreased to compensate for the smaller T_CKL compared to T_CKH in a clock cycle.

In one implementation, the durations of TCHQV or TCLQV, or both, are adjusted to make the TWH and TWL strobe windows within a known range of one another, such that the difference between the TWH and TWL strobe windows is within a known threshold value. When the TWH and TWL strobe windows are equal, the difference is zero. However, in some cases the TWH and TWL strobe windows may not be equal, but slightly varying values may be acceptable as long as the difference is within the threshold value. For example, the threshold value can be in the order of 0.001 ns. In such cases, the DQ duty cycle is not exactly fifty percent, but a difference value that is within an acceptable range of fifty percent (e.g., forty nine to fifty one percent).

Figure 4:
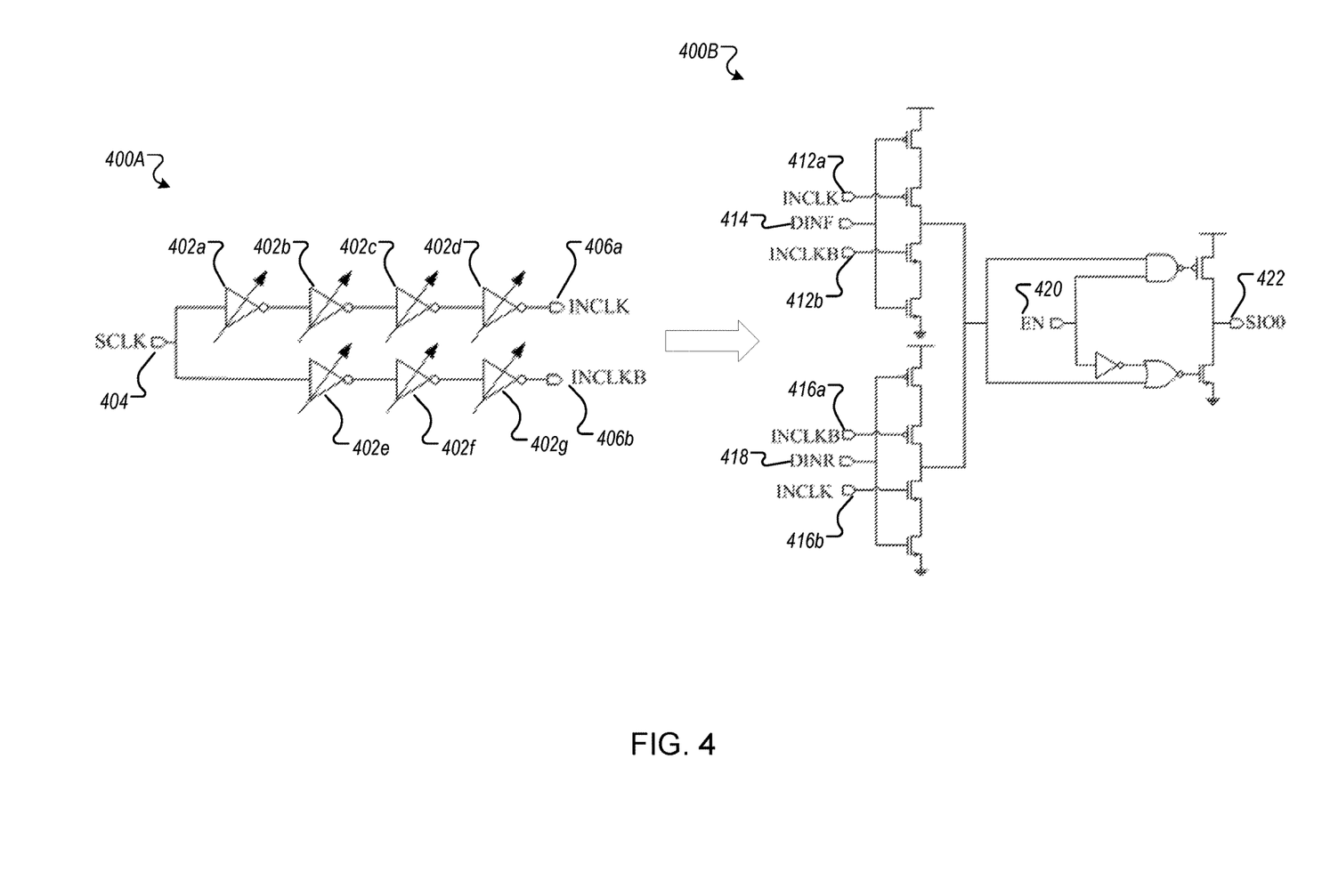
FIG. 4 illustrates an example of a control circuit used in a buffer of a memory device to adjust strobe windows for DQ duty cycle, according to one implementation.

FIG. 4 illustrates an example of a control circuit 400A used in a buffer 400B of a memory device to adjust strobe windows for DQ duty cycle, according to one implementation. In one implementation, the control circuit 400A and the buffer 400B are implemented in a nonvolatile memory device, e.g., a serial NOR flash or NAND flash chip. In one implementation, the control circuit 400A and the buffer 400B are implemented in the memory device 100. However, the control circuit 400A and the buffer 400B can also be implemented in other types of memory devices.

The control circuit 400A includes one or more configurable inverters, e.g., 402a, 402b, 402c, 402d, 402e, 402f and 402g. The control circuit 400A receives the system clock signal SCLK at an input 404 of the circuit, and produces delayed internal signals INCLK and INCLKB at two outputs of the circuit, 406a and 406b respectively. Inverters 402a, 402b, 402c and 402d are coupled to one another in a train along one path of the control circuit 400A to generate INCLK at output 406a, while inverters 402e, 402f and 402g are coupled to one another in a train along a second path of the control circuit 400A to generate INCLKB at output 406b.

The generation time for INCLK or INCLKB, compared to the time when a rising edge or falling edge of SCLK is received at 404, can be adjusted by configuring one or more of the configurable inverters 402a-402g. This control over the generation of INCLK or INCLKB is used to adjust the TCHQV and TCLQV delay times of the memory device, e.g., to compensate for variations in the clock cycle of SCLK.

One or more of the inverters 402a, 402b, 402c and 402d can be adjusted to adjust the delay associated with generating INCLK with respect to SCLK. Independent of the adjustment of the inverters 402a, 402b, 402c, or 402d, one or more of the inverters 402e, 402f and 402g can be adjusted to adjust the delay associated with generation of INCLKB with respect to SCLK. In this manner, SCLK propagated along the two paths of the control circuit 400A can be adjusted independently by configuring the inverters along each path. Accordingly, the duration of TCLQV and TCHQV can be adjusted independently using the configurable inverters in the control circuit 400A.

In one implementation, the number of configurable inverters in the control circuit is different from that shown in FIG. 4. For example, the number of configurable inverters can be less than seven, or greater than seven.

In one implementation, the numbers of configurable inverters in the two output paths of the control circuit are different from that shown in FIG. 4. For example, the number of configurable inverters generating the output 406a can be less than four, or greater than four. Additionally or alternatively, the number of configurable inverters generating the output 406b can be less than three, or greater than three.

INCLK and INCLKB are provided as inputs 412a and 412b respectively in a first circuit branch of the buffer 400B. Internal data of the memory device, e.g., raw data from the memory cells, is provided as input DINF 414 in the first circuit branch of the buffer 400B. INCLK and INCLKB are also provided as inputs 414a and 414b respectively in a second circuit branch of the buffer 400B. The internal data of the memory device, e.g., raw data from the memory cells, is also provided as input DINR 418 in the second circuit branch of the buffer 400B. DINF and DINR are processed and provided as memory output data by the buffer 400B at the falling and rising edges of SCLK respectively, as described below.

An enable signal EN, which is provided at an input 420 of the buffer 400B, is used to control output of the memory data by the serial input/output pins SIO of the memory device. FIG. 4 shows one serial input/output pin SIO0 as output 422 of the buffer 400B. However, additional serial input/output pins (e.g., SIO[n:1]) also may be present. The following section describes operation of the buffer 400B based on SIO0, with the understanding that these operations are also applicable to other serial input/output pins of the buffer 400B.

When EN is at ground voltage (e.g., EN=0), SIO0 is in data input state. When EN is at the system voltage (e.g., EN=VDD), SIO0 is in data output state. In one implementation, when SIO0 is in the output state, DINR is provided at SIO0 as the memory data output at the rising edge of SCLK. At the falling edge of SCLK, DINR is provided at SIO0 as the memory data output. Accordingly, DINR is output as valid memory data in TWH strobe window, while DINF is output as valid memory data in TWL strobe window of a DQ duty cycle.

As noted above, by adjusting INCLK and/or INCLKB based on adjusting the configurable inverters 402a-402g in the control circuit 400A, the time at which DINR or DINF is output by SIO0 can be adjusted. The adjustment to INCLK and/or INCLKB therefore adjusts TCHQV or TCLQV, such that the TWH strobe window and the TWL strobe window are adjusted. In this manner, in one implementation, differences in T_CKH and T_CKL in a clock cycle of SCLK can be compensated by the control circuit 400A, such that the TWH and TWL strobe windows at the SIO0 output 422 are made equal.

Figure 5:
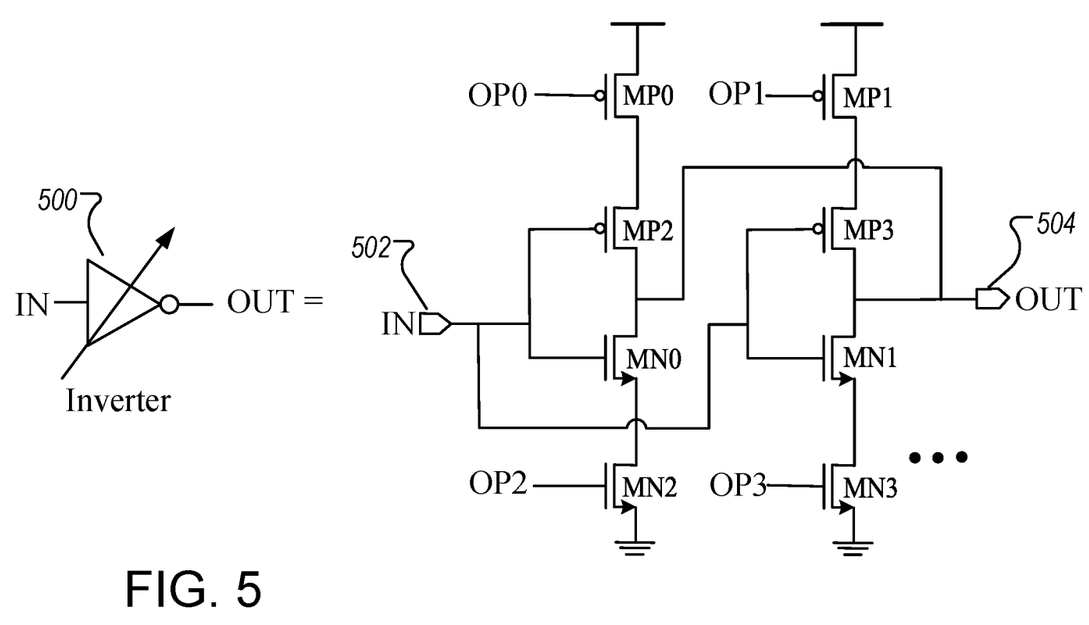
FIG. 5 illustrates an example of a circuit of a configurable inverter of a control circuit in a memory device, according to one implementation.

FIG. 5 illustrates an example of a circuit of a configurable inverter 500 of a control circuit in a memory device, according to one implementation. In one implementation, the configurable inverter 500 is used in the control circuit 400B. For example, the configurable inverter 500 can be one of 402a-402g.

The configurable inverter 500 includes one or more transistors, e.g., MP0, MP1, MP2, MP3, MN0, MN1, MN2 and MN3. In one implementation, MP0, MP1, MP2 and MP3 are p-type metal-oxide-semiconductor field-effect transistors (p-MOSFET or pMOS), while MN0, MN1, MN2 and MN3 are n-type metal-oxide-semiconductor field-effect transistors (n-MOSFET or nMOS). In one implementation, the dimensions of the transistors are approximately in a range given by Table I. However, the dimensions can be different in different implementations.

TABLE 1

Representative Widths of Transistors in a Configurable Inverter

| | Transistor widths (microns) |
|---|---|
| MP0 | 100 |
| MP1 | 100 |
| MP2 | 10 |
| MP3 | 20 |
| MN0 | 5 |
| MN1 | 10 |
| MN2 | 50 |
| MN3 | 50 |

Although the configurable inverter 500 is shown to include four pMOS transistors MP0-MP3 and four nMOS transistors MN0-MN3, alternative configurations are possible. For example, in one implementation, a configurable inverter used in the control circuit 400A can include a different number of pMOS transistors, and/or a different number of nMOS transistors. In one implementation, a configurable inverter used in the control circuit 400A can include transistors of a different type, e.g., bipolar junction transistors (BJT), junction field-effect transistors (JFET), among others, instead of pMOS or nMOS transistors. In one implementation, a configurable inverter used in the control circuit 400A can include a combination of transistors of different types, e.g., one or more of pMOS, nMOS, BJT, and/or JFET, among other types.

An input signal IN is provided at an input 502 of the inverter circuit, while an output signal OUT is generated at an output 504 of the inverter circuit. In one implementation, the input signal is the system clock signal SCLK, while the output signal is a delayed version of SCLK.

The inverter 500 includes additional inputs OP0, OP1, OP2, and OP3, which are used to apply bias voltages to some of the transistors in the inverter. The output of the inverter 500 can be delayed by applying different bias voltages to the gates of some of the transistors. As shown, in one implementation, the input EN is used to bias some of the transistors, e.g., MP2, MP3, MN0 and MN1. The other transistors are biased by applying external voltages to their gates. For example, MP0, MP1, MN2 and MN3 are biased by applying voltages to their gates at inputs OP0, OP1, OP2, and OP3 respectively of the inverter 500. The voltages applied at OP0, OP1, OP2 and OP3 are controllable by the user, and application of these voltages can be used to turn on or off the respective transistors. By turning on or off the transistors MP0, MP1, MN2 and MN3 in this manner, the output provided by the inverter 500 can be controlled.

Table II provides an example of voltages that can be applied to the gates of transistors MP0, MP1, MN2 and MN3 using the inputs OP0, OP1, OP2, and OP3 of the inverter 500, respectively, to adjust the values of TCHQV and TCLQV, according to one implementation.

TABLE 2

Representative Values for Transistor Bias Voltages to Adjust Internal Delay

| | Default | Reduce TCHQV | Reduce TCLQV | Increase TCHQV | Increase TCLQV |
|---|---|---|---|---|---|
| OP0 | VDD | VDD | 0 | VDD | 0 |
| OP1 | 0 | 0 | 0 | 0 | VDD |
| OP2 | 0 | VDD | 0 | VDD | 0 |
| OP3 | VDD | VDD | VDD | 0 | VDD |

As shown by Table II, TCHQV and TCLQV can be maintained at their default values by setting OP0 and OP3 to the system voltage (e.g., VDD) and setting OP1 and OP2 to zero voltages (e.g., ground). The duration of TCHQV can be reduced by adjusting OP0, OP2 and OP3 to be at the system voltage (e.g., VDD) and setting OP1 to be at zero voltage (e.g., ground). The duration of TCLQV can be reduced by adjusting OP0, OP1 and OP2 to be at zero voltage (e.g., ground) and setting OP3 to be at the system voltage (e.g., VDD). On the other hand, the duration of TCHQV can be increased by adjusting OP0 and OP2 to be at the system voltage (e.g., VDD) and setting OP1 and OP3 to be at zero voltage (e.g., ground). The duration of TCLQV can be increased by adjusting OP0 and OP2 to be at zero voltage (e.g., ground) and setting OP1 and OP3 to be at the system voltage (e.g., VDD).

In another implementation, alternative values of the configurable bias voltages are used. In one implementation, the useful bias voltages depend on the dimensions of the transistors, or the circuit connectivity of the transistors, or both, among other reasons. In one implementation, the configurable bias voltages are applied to a different set of transistors. For example, the input signal IN may be used to bias a different group of transistors, or the inputs OP0, OP1, OP2 and OP3 may be connected to a different group of transistors than shown in the circuit of inverter 500, or both.

In the above manner, the inverter 500 can be configured by applying different bias voltages to the gates of some of the transistors in the inverter. The application of the different bias voltages can be used to adjust the internal TCHQV and TCLQV delay times of the memory device such that the TWH and TWL strobe windows in a DQ duty cycle can be made equal to one another.

Figure 6:
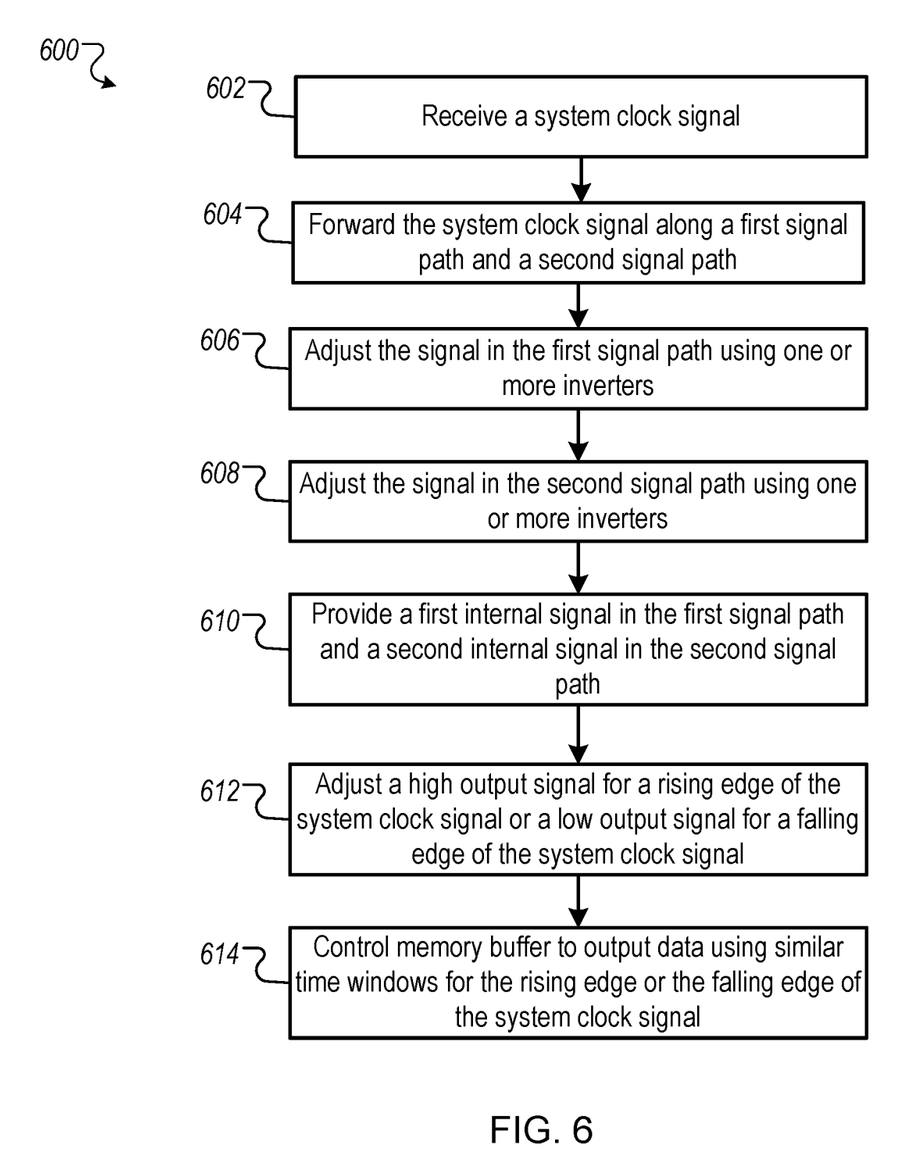
FIG. 6 illustrates an example of a process to adjust strobe windows for DQ duty cycle of a memory device, according to one implementation.

FIG. 6 illustrates an example of a process 600 to adjust strobe windows for DQ duty cycle of a memory device, according to one implementation. In one implementation, the process 600 is performed by the control circuit 400A to provide INCLK and INCLKB to the buffer 400B. In one implementation, the process 600 is performed by one or more processors associated with the memory device that includes the control circuit 400A and the buffer 400B. Accordingly, the following sections describe the process 600 with respect to the control circuit 400A and the buffer 400B. However, in other implementations, the process 600 may be performed by other devices or systems.

At 602, a system clock signal is received. For example, SCLK is received at input 404 of the control circuit 400A.

At 604, the system clock signal is forwarded along a first signal path and a second signal path. For example, SCLK is forwarded along a first path in the control circuit 400B that includes the train of configurable inverters 402a, 402b, 402c and 402d. SCLK is also forwarded along a second path in the control circuit 400B that includes the train of configurable inverters 402e, 402f and 402g.

At 606, the signal in the first path is adjusted using one or more inverters. For example, one or more of the configurable inverters 402a, 402b, 402c and 402d are adjusted to increase or decrease the delay associated with outputting INCLK at output 406a based on SCLK. A configurable inverter is adjusted by applying different values of bias voltages to the transistors in the inverter by using the inputs OP0, OP1, OP2 and OP3 of the inverter. As shown by the representative example of Table II, the bias voltage values are chosen to increase or decrease TCHQV, or TCLQV, or both, which is based on whether the T_CKH period is greater than, or less than, the T_CKL period in one clock cycle of SCLK. In one implementation, the bias voltage values are chosen such that TCHQV, or TCLQV, or both, are unchanged. This may be the case, for example, when T_CKH is equal to T_CKL in one clock cycle of SCLK.

At 608, the signal in the second path is adjusted using one or more inverters. For example, one or more of the configurable inverters 402e, 402f and 402g are adjusted to increase or decrease the delay associated with outputting INCLKB at output 406b based on SCLK. As described above, one or more configurable inverters are adjusted by applying different values of bias voltages to the transistors in the respective inverters. The adjustment is done to increase or decrease TCHQV, or TCLQV, or both, depending on whether T_CKH is greater than, or less than, T_CKL in one clock cycle of SCLK. However, in one implementation, the bias voltage values are chosen such that TCHQV, or TCLQV, or both, are unchanged. This may be the case, for example, when T_CKH is equal to T_CKL in one clock cycle of SCLK.

In one implementation, either the signal in the first path is adjusted at 606, or the signal in the second path is adjusted at 608, but not both. This may be the case, for example, when adjusting the value of INCLK or INCLKB is sufficient to compensate for any variation in the SCLK clock cycle.

At 610, a first internal signal is provided in the first signal path and a second internal signal is provided in the second signal path. For example, INCLK is provided at output 406a of the control circuit 400A, and INCLKB is provided at output 406b of the control circuit 400A. INCLK is fed to the buffer 400B at buffer inputs 412a and 416a. INCLKB is fed to the buffer 400B at buffer inputs 412b and 416b.

At 612, a high output signal for a rising edge of the system clock signal is adjusted or a low output signal for a falling edge of the system clock signal is adjusted. For example, when the buffer 400B is in output mode (e.g., EN=VDD), the duration of TCHQV or TCLQV is adjusted using INCLK and INCLKB provided as inputs to the buffer 400B.

At 614, memory buffer is controlled to output data using similar time windows for the rising edge or the falling edge of the system clock signal. For example, the buffer 400B is controlled to output DINR data at the SIO0 pin with a strobe window TWH during the rising edge of SCLK, and output DINF data at the SIO0 output pin with a strobe window TWL during the rising edge of SCLK. Based on adjusting the duration of TCHQV or TCLQV at 612, TWH strobe window is made equal to TWL strobe window.

In the above manner, the process 600 can be used to output data by the memory device operating in DTR mode using equal strobe windows at rising and falling edges of the system clock signal. The strobe windows are made equal by adjusting the TCHQV or TCLQV delay times based on the internal signals INCLK and INCLKB, for example, to compensate for variations in the SCLK clock cycle.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device comprising:
    a control circuit that comprises a first signal path and a second signal path, each including one or more inverters, the control circuit configured to perform operations comprising:
        receiving a system clock signal at an input of the control circuit;
        generating a data transition signal based on the system clock signal, wherein the data transition signal includes a first internal signal and a second internal signal, and wherein generating the data transition signal comprises:
            adjusting the system clock signal using one or more inverters in the first signal path to generate the first internal signal at an output of the first path, and
            adjusting the system clock signal using one or more inverters in the second signal path to generate the second internal signal at an output of the second path; and
        providing the data transition signal to an output buffer of the memory device, wherein the output buffer is configured to output memory data based on the data transition signal; and
    the output buffer that is configured to perform operations comprising:
        receiving the first internal signal and the second internal signal at inputs of the output buffer;
        in response to receiving a rising edge of the system clock signal at the control circuit, outputting memory data using a first time window that is based on the first internal signal and the second internal signal; and
        in response to receiving a falling edge of the system clock signal at the control circuit, outputting memory data using a second time window that is based on the first internal signal and the second internal signal.

2. The memory device of claim 1, wherein the control circuit is configured to adjust at least one of a time delay corresponding to generation of the first internal signal or a time delay corresponding to generation of the second internal signal such that a difference between the first time window and the second time window is within a preselected threshold value.

3. The memory device of claim 1, wherein the control circuit is configured to perform operations comprising:
    receiving a rising edge or a falling edge of the system clock signal at the input of the control circuit;
    in response to receiving the rising edge of the system clock signal, adjusting a first time delay associated with generating the first internal signal or the second internal signal to control output of the memory data by the output buffer using the first time window; and
    in response to receiving the falling edge of the system clock signal, adjusting a second time delay associated with generating the first internal signal or the second internal signal to control output of the memory data by the output buffer using the second time window.

4. The memory device of claim 3, wherein the control circuit is configured to adjust the first time delay independent of the second time delay.

5. The memory device of claim 1, wherein an inverter includes a plurality of transistors, and wherein an output of the inverter can be adjusted by adjusting gate voltages provided to one or more of the transistors.

6. The memory device of claim 5, wherein the control circuit is configured to perform operations comprising:
    receiving a rising edge or a falling edge of the system clock signal at the input of the control circuit; and
    providing different values of gate voltages to one or more transistors in one or more inverters in at least one of the first signal path or the second signal path to generate the first internal signal or the second internal signal with different time delays based on the rising edge or the falling edge of the system clock signal.

7. A method for generating a data transition signal, the method comprising:
    receiving, at an input of a control circuit that is coupled to an output buffer, a system clock signal;
    generating, by the control circuit, the data transition signal based on the system clock signal, wherein the control circuit comprises a first signal path and a second signal path, each including one or more inverters, wherein the data transition signal includes a first internal signal and a second internal signal, and wherein generating the data transition signal comprises:
        adjusting the system clock signal using one or more inverters in the first signal path to generate the first internal signal at an output of the first path, and
        adjusting the system clock signal using one or more inverters in the second signal path to generate the second internal signal at an output of the second path;
    providing, by the control circuit, the data transition signal to the output buffer that is configured to output data based on the data transition signal;
    receiving, at the output buffer, the first internal signal and the second internal signal from the control circuit
    in response to receiving a rising edge of the system clock signal at the control circuit, outputting, by the output buffer, data using a first time window that is based on the first internal signal and the second internal signal; and in response to receiving a falling edge of the system clock signal at the control circuit, outputting, by the output buffer, data using a second time window that is based on the first internal signal and the second internal signal.

8. The method of claim 7, further comprising:

adjusting, by the control circuit, at least one of a time delay associated with generation of the first internal signal or a time delay associated with generation of the second internal signal such that a difference between the first time window and the second time window is within a preselected threshold value.

9. The method of claim 7, further comprising:

receiving a rising edge or a falling edge of the system clock signal at the input of the control circuit;

in response to receiving the rising edge of the system clock signal, adjusting a first time delay associated with generating the first internal signal or the second internal signal to control output of the data by the output buffer using the first time window; and in response to receiving the falling edge of the system clock signal, adjusting a second time delay associated with generating the first internal signal or the second internal signal to control output of the data by the output buffer using the second time window.

10. The method of claim 9, further comprising:

adjusting, by the control circuit, the first time delay independent of the second time delay.

11. The method of claim 7, wherein an inverter includes a plurality of transistors, and wherein adjusting the system clock signal using one or more inverters in the first signal path or the second signal path comprises:

receiving a rising edge or a falling edge of the system clock signal at the input of the control circuit; and providing different values of gate voltages to one or more transistors included in one or more inverters in at least one of the first signal path or the second signal path to generate the first internal signal or the second internal signal with different time delays based on the rising edge or the falling edge of the system clock signal.

12. A system for generating a data transition signal, the system comprising:

a memory device with a control circuit that comprises a first signal path and a second signal path, each including one or more inverters;

an output buffer coupled to the control circuit; and a storage medium storing instructions that, when executed by one or more processors, are configured to cause the one or more processors to perform operations comprising:

receiving, at an input of the control circuit, a system clock signal;

generating, by the control circuit, the data transition signal based on the system clock signal, wherein the data transition signal includes a first internal signal and a second internal signal, and wherein generating the data transition signal comprises:

adjusting the system clock signal using one or more inverters in the first signal path to generate the first internal signal at an output of the first path, and adjusting the system clock signal using one or more inverters in the second signal path to generate the second internal signal at an output of the second path;

providing, by the control circuit, the data transition signal to the output buffer that is configured to output memory data based on the data transition signal;

receiving, at the output buffer, the first internal signal and the second internal signal from the control circuit in response to receiving a rising edge of the system clock signal at the control circuit, outputting, by the output buffer, data using a first time window that is based on the first internal signal and the second internal signal; and in response to receiving a falling edge of the system clock signal at the control circuit, outputting, by the output buffer, data using a second time window that is based on the first internal signal and the second internal signal.

13. The system of claim 12, wherein an inverter in the control circuit includes a plurality of transistors, and wherein adjusting the system clock signal using one or more inverters in the first signal path or the second signal path comprises:

receiving a rising edge or a falling edge of the system clock signal at the input of the control circuit;

in response to receiving the rising edge of the system clock signal:

adjusting a first time delay associated with generating the first internal signal or the second internal signal by providing different values of gate voltages to one or more transistors included in one or more inverters in the first signal path or the second signal path, and controlling output of the memory data by the output buffer using a first time window based on the first time delay; and in response to receiving the falling edge of the system clock signal:

adjusting a second time delay associated with generating the first internal signal or the second internal signal by providing different values of gate voltages to one or more transistors included in one or more inverters in the first signal path or the second signal path, and controlling output of the memory data by the output buffer using a second time window based on the second time delay.

14. The system of claim 13, wherein the first time delay is adjusted independent of the second time delay, and wherein at least one of the first time delay or the second time delay is adjusted such that a difference between the first time window and the second time window is within a preselected threshold value.

* * * * *

UNITED STATES PATENT AND TRADEMARK OFFICE
CERTIFICATE OF CORRECTION

PATENT NO. : 10,185,697 B2
APPLICATION NO. : 15/006316
DATED : January 22, 2019
INVENTOR(S) : Shang-Chi Yang et al.

Page 1 of 1

It is certified that error appears in the above-identified patent and that said Letters Patent is hereby corrected as shown below:

In the Claims

Claim 7
Column 14, Line 65, delete "circuit" and insert --circuit;--.

Claim 12
Column 16, Line 14, delete "circuit" and insert --circuit;--.

Signed and Sealed this
Eleventh Day of June, 2019

Andrei Iancu
*Director of the United States Patent and Trademark Office*